(12) United States Patent
O'Connor

(10) Patent No.: US 11,218,182 B2
(45) Date of Patent: Jan. 4, 2022

(54) SYSTEMS AND METHODS FOR GENERATING RADIO FREQUENCY SIGNALS

(71) Applicant: NANOELECTROMAGNETICS LLC, Columbia, MO (US)

(72) Inventor: Kevin A. O'Connor, Columbia, MO (US)

(73) Assignee: Nanoelectromagnetics LLC, Columbia, MO (US)

( * ) Notice: Subject to any disclaimer, the term of this patent is extended or adjusted under 35 U.S.C. 154(b) by 0 days.

(21) Appl. No.: 16/817,284

(22) Filed: Mar. 12, 2020

(65) Prior Publication Data

US 2020/0295797 A1  Sep. 17, 2020

Related U.S. Application Data

(60) Provisional application No. 62/817,141, filed on Mar. 12, 2019.

(51) Int. Cl.
| | |
|---|---|
| *H04B 1/46* | (2006.01) |
| *H04B 1/403* | (2015.01) |
| *H03F 3/66* | (2006.01) |
| *H04B 1/22* | (2006.01) |
| *H04B 1/00* | (2006.01) |

(52) U.S. Cl.
CPC ............ *H04B 1/403* (2013.01); *H03F 3/66* (2013.01); *H04B 1/0082* (2013.01); *H04B 1/22* (2013.01)

(58) Field of Classification Search
CPC ......... H04B 1/043; H04B 1/0082; H04B 1/22
See application file for complete search history.

(56) References Cited

U.S. PATENT DOCUMENTS

| | | | | |
|---|---|---|---|---|
| 3,668,416 A | * | 6/1972 | Marilleau | H03K 3/537 307/106 |
| 4,168,441 A | * | 9/1979 | McDonald | H03K 3/38 327/186 |
| 6,195,274 B1 | * | 2/2001 | Schroderus | G01R 19/0092 363/39 |
| 2009/0045886 A1 | * | 2/2009 | Gruchalla | H01P 5/10 333/26 |
| 2011/0293041 A1 | * | 12/2011 | Luo | H04L 5/20 375/316 |

* cited by examiner

*Primary Examiner* — Tuan Pham
(74) *Attorney, Agent, or Firm* — FisherBroyles LLP; Gregory T. Fettig

(57) ABSTRACT

The present embodiments are directed to a device for generating radio frequency signals, including high power radio frequency signals. In certain embodiments, the device comprises multiple transmission lines driven in parallel at their input and connected in series at their output. The electromagnetic transit lengths of the transmission lines may be unequal. A series connection of the transmission lines at the output may produce an output signal from each transmission line driving the same polarity signal to the load. The series connection of transmission lines at the output may produce a bipolar output signal. One section of the device may convert a unipolar input signal into a bipolar signal. One section of the device may duplicate the input signal. Multiple sections may be arranged to convert a unipolar input signal into multiple radio frequency oscillations.

20 Claims, 17 Drawing Sheets

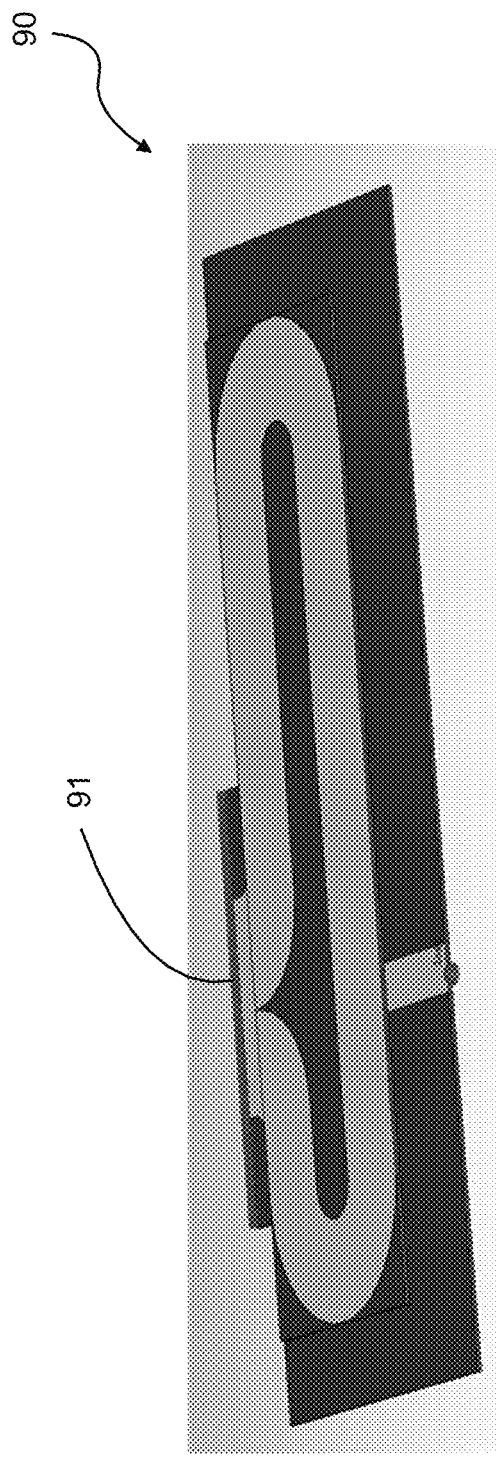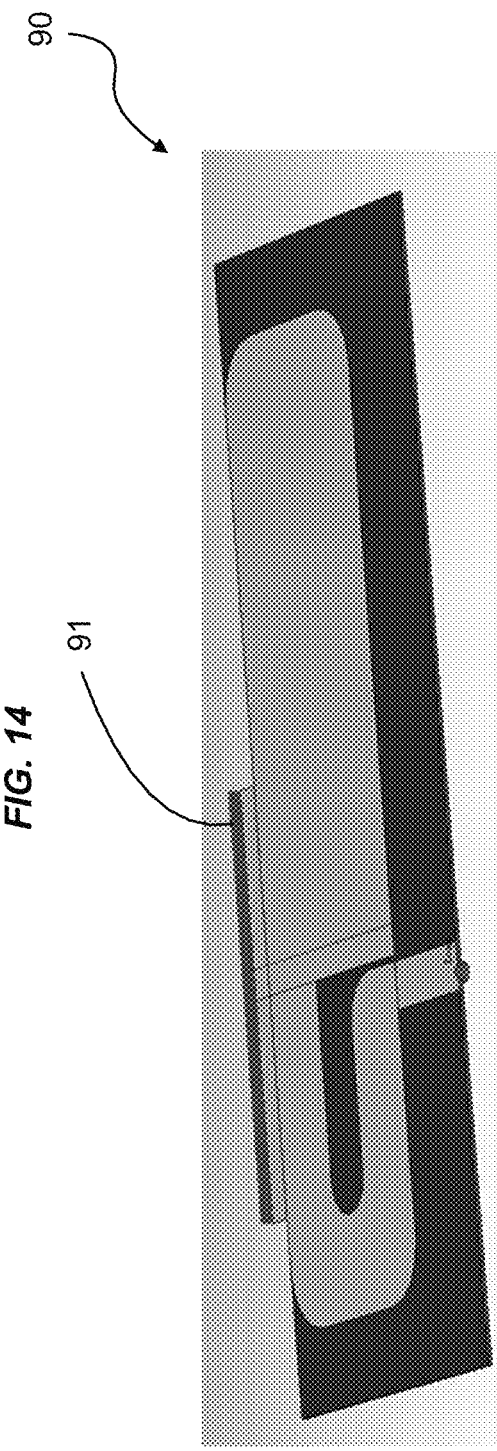
FIG. 14
FIG. 15

SYSTEMS AND METHODS FOR GENERATING RADIO FREQUENCY SIGNALS

CROSS REFERENCE TO RELATED APPLICATIONS

This patent application claims priority to, and thus the benefit of an earlier filing date from, U.S. Provisional Patent Application No. 62/817,141 (filed Mar. 12, 2019), the contents of which are hereby incorporated by reference.

BACKGROUND

The availability of devices capable of producing high power microwave (HPM) or high power radio frequency (HPRF) signals is limited due to high voltage and high current requirements. High power sources have typically been implemented in the form of vacuum electronic devices. There is a need for solid-state sources of high power electromagnetic signals because solid-state sources have the potential to significantly reduce the size, weight, and cost of high power sources. But, the solid-state sources available in the art are highly inefficient and cannot match the output power capabilities of tube-based sources.

Vacuum electronic devices have long been used to generate both low and high power RF signals. By accelerating electrons in a vacuum tube device, electromagnetic waves are produced, which can then be coupled out through a waveguide or via a coupler to a transmission line. Tubes designed for high average power or high peak power operation can produce signals ranging from continuous operation at less than 1 kW to short bursts at greater than 1 GW. Many types of vacuum electronic tube devices have been developed for the production of HPM and HPRF, including but not limited to magnetrons, gyrotrons, vircators, klystrons, traveling wave tubes, backward wave oscillators, magnetically-insulated line oscillators, reltrons, free electron lasers, o-type Cerenkov devices, relativistic diffraction generators, multi-wave diffraction generators, multiwave Cerenkov generators, dielectric Cerenkov masers, plasma Cerenkov masers, and slow-wave structures.

While these devices can operate at higher power levels than solid-state devices, there are disadvantages to their use. These disadvantages include the requirement to maintain a vacuum environment, which adds to the size, weight, cost, and complexity of the system. Additionally, frequency agility and bandwidth control are limited in most devices as the operating frequencies are often determined by resonant structures that cannot be dynamically modified. And, efficiency in converting input power into output RF is typically poor, resulting in heating issues for high power devices. Heating and other factors contribute to the limited lifetime of high power microwave devices, which decreases reliability and increases operational costs. These disadvantages make vacuum electronics sources of HPM or HPRF incompatible with many applications that require small size, weight, and device portability.

Solid-state sources do not incorporate vacuum electronics to produce an electromagnetic signal. Instead, they incorporate semiconductor devices and/or other solid or liquid conductors. Solid-state amplifiers based on semiconductor switches have improved over the past few decades to increase the power level of a single amplifier based on a single transistor to the order of hundreds of watts. There are many types of amplifiers, including but not limited to class A, class AB, class B, class C, class D, class E, class F, and solid-state pulsed power amplifiers. There are also multiple techniques to combine the output of many amplifiers to increase the total output power. These systems can produce average power levels on the order of tens to hundreds of kilowatts. However, the power and cooling requirements for these systems contributes to the relatively large size and weight for these systems. Additionally, the complexity associated with high power combiners decreases reliability and increases costs of operation. Without a breakthrough in the power handling capability of semiconductor-based amplifiers, scaling to higher power will be limited by the complexity, cost, size, and weight of the system.

Solid-state sources capable of producing high power output from a single device have previously been proposed. One example is a frozen wave generator (FWG). The FWG operates by charging multiple transmission lines with alternating polarity. When one or more switches is closed to connect the charged transmission lines, the transmission lines are discharged, resulting in a train of pulses appearing at the load impedance. Depending on the voltage rating and closing time of the switch(es), it is possible to output a high power signal from a single FWG. However, there are limitations to the FWG. The FWG is often implemented with multiple switches to decrease parasitic inductance in the circuit, which can degrade the RF output. These switches must each be capable of holding off a full bipolar charge difference and close very fast (e.g., typically less than 1 ns), so the requirement for more than one switch per FWG increases the cost and complexity of the system. The use of two power supplies to charge the transmission lines positive and negative also increases complexity and cost. The functions of energy storage and RF generation are both achieved with the same transmission lines. This limits the ability to drive the FWG with other types of sources and limits the repetition rate by the charging time of the transmission lines.

Other solid-state sources of RF based on charged transmission lines are known in the art. These include but are not limited to pulse forming lines, impedance mismatched pulse forming lines, Blumlein lines, and translationally symmetric transmission lines (TSTLs). Similar to the FWG, these solid-state sources operate by first charging the transmission lines and then quickly discharging the transmission lines with a fast switch. This limits the compatibility of these sources to be driven by other sources and limits the repetition rate by the charging time of the transmission lines. Thus, solid-state RF sources are needed that can be driven by multiple types of pulsers and are not limited in repetition rate by the need to charge the RF-generating device.

Non-linear transmission lines (NLTLs) are other types of solid-state sources of RF signals that have been developed for high power operation. NLTLs generate an RF signal due to variation of the inductance and/or capacitance of the transmission lines when driven by an input pulse. Since the pulse is generated externally to the NLTL, the NLTL can be driven by multiple different types of pulsers unlike the FWG and TSTL. NLTLs are constructed with non-linear materials or components such that the transmission line properties along the line change with time and distance along the line. Gyromagnetic NLTLs incorporate non-linear magnetic materials, such as ferromagnetic materials or ferrites, whose relative permeability changes with respect to the magnetic field strength in the material. Similarly, non-linear dielectric materials, such as ferroelectrics, have a variable relative permittivity dependent on the electric field strength in the material and are implemented in capacitive NLTLs. In addition to the use of non-linear materials, the non-linear capacitance of reverse-biased diodes has been used to form NLTLs. The variation of one or more of these material or device properties causes soliton formation along the nonlinear transmission line, producing an RF signal at the output. When designed for high voltage operation, many of these lines can be driven at high peak power and at high repetition rate for high average power.

However, there are many disadvantages to NLTLs. In particular, the RF conversion efficiency (e.g., the efficiency with which the NLTL converts the input pulse into an RF output signal) is very low. The voltage modulation depth is low, meaning the RF produced by the input pulse is a relatively small percentage of the pulse magnitude. Most of the pulse energy is transmitted through to the output at the low frequency of the input pulse. The RF energy that is produced is thus riding on the direct current (DC) bias of the input pulse, so the output RF is not truly bipolar. For some antenna systems and other loads, a bipolar output with little or no DC bias is preferred. Additionally, the solitons that are produced with an NLTL are highly damped such that the magnitude is high for only the first few cycles before rapidly becoming negligible.

Another disadvantage is that most NLTLs require a biasing field to operate. In gyromagnetic NLTLs, a bias magnetic field is often created by a solenoid around the NLTL. This bias field is often driven by a separate continuous or pulsed power supply, increasing the cost and complexity of the system. Diode-based NLTLs operate with the diodes under a reverse bias, requiring an additional power supply and biasing system, which add to system cost and complexity. Finally, the changing properties of the transmission line in time result in dynamic reflection and transmission coefficients at the input and output connections. These transient transmission line properties prevent efficient matching to transfer the output signal to an external load. Thus, there is a need for a source of high power RF signals that can provide impedance matching to both the pulsed source and load while using only linear elements.

In summary, the current state of the art does not meet the needs for a high power source of radio frequency signals. Generally, no device meets the following requirements: solid-state materials; high power capability in a single device; compatibility with multiple sources of input energy; linear materials; components; and operation modes; no bias field; high RF conversion efficiency; bipolar output signal; frequency and bandwidth agility; and scalability to power levels of greater than 1 GW. Thus, there is a need for new solid-state sources of HPM and/or HPRF signals.

SUMMARY

The embodiments herein are generally directed to the generation of radio frequency signals, including high power radio frequency signals that overcome the previous problems with a single device (e.g., as an alternative to NLTLs). The device may be operable to convert a relatively short duration input signal into an RF output signal of one or more cycles capable of being radiated by an antenna and/or being delivered to another load. Similar to NLTLs, the present embodiments do not require being charged but may rather act to modulate an input signal into multiple output RF cycles. Thus, one device may be referred to herein as a Pulse-Input, RF-Output (PIRFO) line that converts a pulsed input signal into a bipolar RF signal.

In one embodiment, a device includes two or more transmission lines that are operable to transform an electromagnetic pulsed input signal into an oscillating output signal. The two or more transmission lines may comprise linear transmission lines and materials. An electromagnetic transit time of the transmission lines may be unequal. The transmission lines may be driven in parallel at the input. The transmission lines may be arranged in series at their output. A polarity of the transmission lines may be the same at the output. A polarity of at least one transmission line may be inverted at the output. The transmission lines may be planar microstrip, planar stripline, coaxial, twisted pair, twinax, wire over plane, parallel lines, or various combinations thereof. One or more switching elements along the lengths of one or more transmission lines that may be operable to alter the length of the transmission lines. A difference in transit times may be equal to a pulse width of the input signal. A difference in transit times may be less than a pulse width of the input signal. A difference in transit times may be greater than a pulse width of the input signal. In another embodiment, a device, comprising: two or more transmission lines that are operable to repeat an electromagnetic input signal at an output.

A device, comprising: two or more sections in series and operable to transform an electromagnetic pulsed input signal into an oscillating output signal, wherein each section comprises two or more transmission lines. A difference in transit times of one or more sections may be equal to a pulse width of the input signal. A difference in transit times of one or more sections may be less than a pulse width of the input signal. A difference in transit times of one or more sections may be greater than a pulse width of the input signal.

In one embodiment, the PIRFO geometry can be driven by semiconductor, plasma based, spark gap, thyratron, pseudospark or solid switches, or the switches can be imbedded in the geometry for frequency agility or frequency multiplication. Nonlinear materials may be used, including ferromagnetic, ferroelectric, piezoelectric, semiconductor, or the like, for frequency multiplication, or generation of specific frequencies in the mesoband, narrowband or wideband regime or a combination of any select bands or frequencies.

BRIEF DESCRIPTION OF THE DRAWINGS

Some embodiments are now described, by way of example only, and with reference to the accompanying drawings. The same reference number represents the same element or the same type of element on all drawings.

FIGS. 14 and 15 illustrate a three dimensional (3D) model of an exemplary planar inverter-repeater section.

DETAILED DESCRIPTION OF THE DRAWINGS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
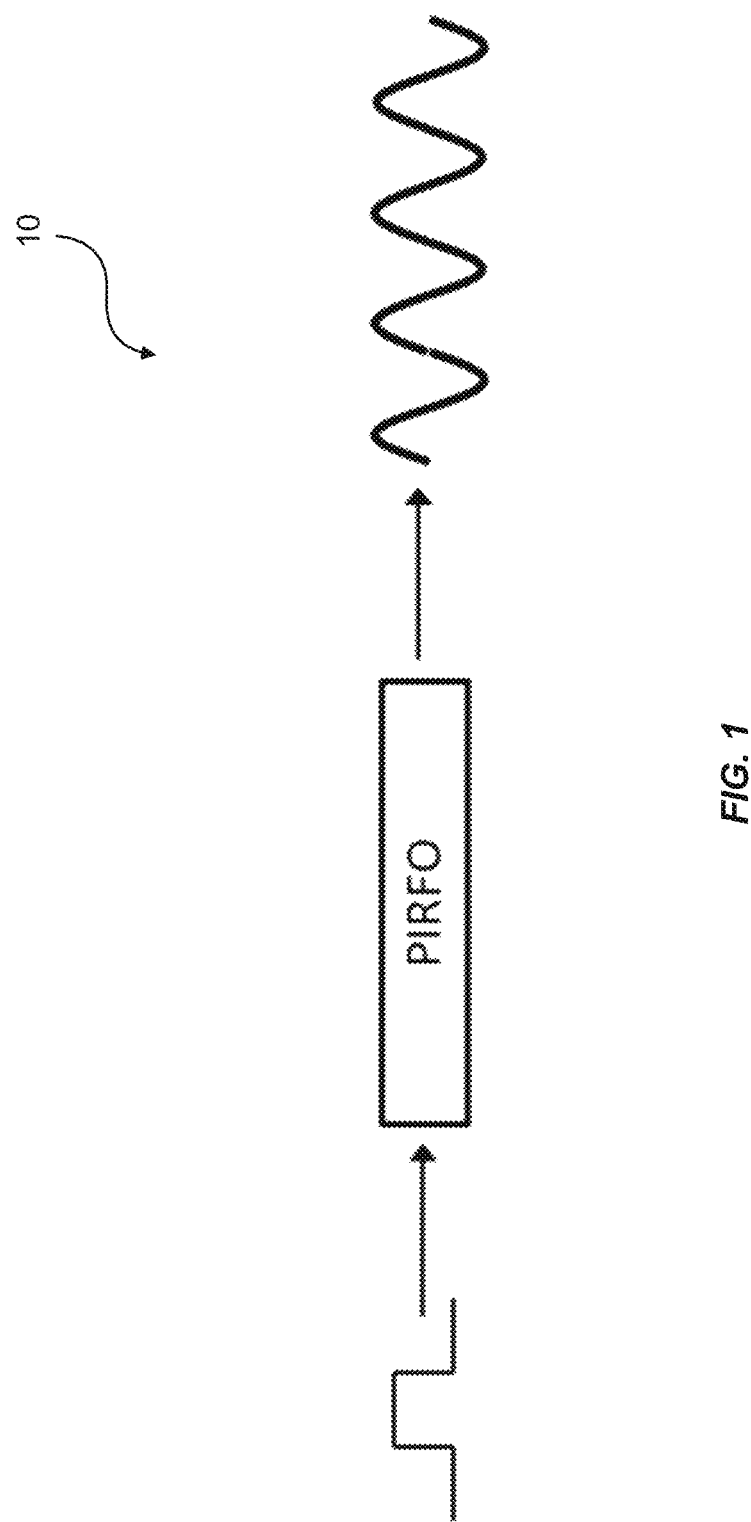
FIG. 1 is a block diagram of an exemplary PIRFO device.

FIG. 1 is a block diagram of an exemplary PIRFO device 10. In one embodiment, the device may be substantially passive based on transmission lines that do not require non-linear materials and/or additional switches. The PIRFO can be driven by unipolar or bipolar pulse-forming lines (PFLs), RF sources, fast ionization dynistors, step recovery diodes, TSTLs, NLTLs, FWGs, or other pulsed or continuous sources of electromagnetic signals. When driven by charged sources, the input signal can be initiated by as fast closing switch such as Photoconductive Semiconductor Switches (PCSS), avalanche switches, or the like. The PIRFO is scalable in operating frequency, bandwidth, repetition rate frequency, and peak power.

The fundamental frequency and bandwidth can be designed to be over a wide range of frequencies based on the rise time and pulse width of the input pulse. The lower frequency limit may be determined by device size limitations, and the upper limit of the fundamental frequency is expected to be greater than 2 GHz. Some embodiments may incorporate transmission lines with conventional dielectrics. The form factor and dimensions may depend on a selected transmission line topology. To further improve SWaP-C2 (e.g., size, weight, power and cost), high dielectric constant materials can be incorporated into the transmission lines, reducing transmission line lengths by a factor of 3 to 10. By adjusting the PIRFO design and/or the pulse width of the input pulse, the bandwidth can be greatly extended to include multiple modes at frequencies higher than the fundamental. In some embodiments, a single device may produce a fundamental output centered at 375 MHz with significant signal strength at higher modes up to at least 2 GHz.

The PIRFO can be designed to be compatible with a wide range of input and output impedances as impedance transformation is necessary to maintain efficient energy transfer in the device. As additional stages of a PIRFO are added to increase the number of output RF cycles, the output impedance increases significantly. Generally, the design favors low input impedance (<5Ω) and high output impedance (50Ω or higher). With the availability of low impedance sources driven by photoswitches, the input impedance of the PIRFO can be reduced to 3 to 5Ω to enable output impedance matching with a load impedance of 50Ω. The input and output connections may be configured as striplines. Thus, the lower limit to the input impedance may be determined by the width of the stripline required for a given impedance and dielectric material. Use of high dielectric constant substrates can reduce the width for a given impedance.

In some embodiments, the PIRFO 10 may be composed of at least two transmission lines. The transmission lines may be formed into units (e.g., individual devices) that form sections of the PIRFO 10. Each device may perform a function of inverting and repeating the input signal (inverter-repeaters) or only repeating the input signal (repeaters). These transmission lines are described with the following examples.

Figure 2:
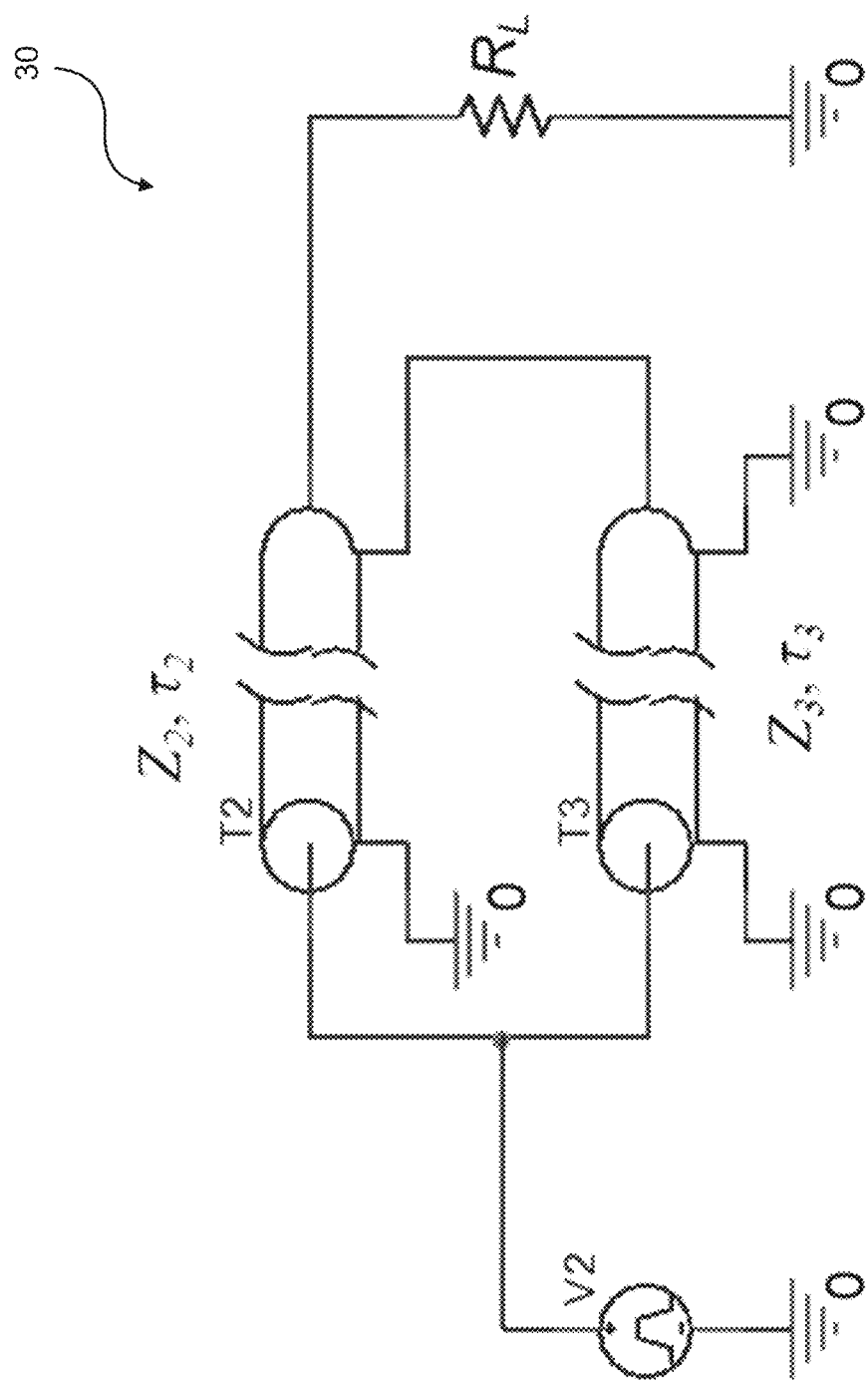
FIG. 2 is a circuit diagram of an exemplary repeater device.

FIG. 2 shows an example circuit for a repeater device 30. The repeater 30 may be formed by the two transmission lines, T2 and T3. To explain their function, the repeater 30 is shown integrated with a generic pulsed signal source, V2, and a load for the repeater device, $R_L$. In the examples, the transmission lines are defined by a characteristic impedance, Z, and a transit time, τ. These parameters are functions of the transmission line geometry and the materials used to form the transmission lines. The transmission lines are often two-conductor lines such as coaxial cable, microstrip, stripline, parallel lines, or twisted pair lines, but other transmission lines can be implemented to form either type of device used in the PIRFO 10. The transmission lines are electrically in parallel at the input and are driven by the input pulse. In some embodiments, the characteristic impedance of the transmission lines in parallel are equal (e.g., $Z_2=Z_3$). In some embodiments, the parallel arrangement of transmission lines at the input are designed to match the impedance of the source of the input signal. In these examples, the common reference point for the transmission lines, voltage sources, and loads are referred to as "ground" and referenced by the circuit ground (i.e., the 0 symbol". The actual reference point could be another common reference other than circuit or earth ground. The transmission lines are grounded at their inputs. At the output ends of the transmission lines (i.e., the ends opposite the end fed by the input signal), one transmission line, T3, is connected to ground. The ungrounded conductor of T3 is connected to the output end of the conductor of T2 that is grounded at its input. The other conductor of transmission line T2 is connected to the load of the repeater device, $R_L$. If more than two transmission lines are used in the repeater, the ungrounded conductor of T2 would be connected to the output end of the conductor grounded at the input end of the third transmission line. This pattern would repeat for as many transmission lines as are included in the repeater until the last conductor is connected to the load as one conductor of T2 is connected to the load. The load, which is shown as a resistance referenced to ground, could be a resistive element, another transmission line, an antenna, or another component with an impedance equal to $R_L$.

The circuit 30 can also be described as a pulse transformer. When operated as a pulse transformer, the characteristic impedances of the transmission lines are typically equal (e.g., $Z_2=Z_3$), and the impedance of the load is typically equal to the product of the characteristic impedance of the transmission lines and the number of transmission lines in parallel at the input (e.g., $R_L=2Z_2=2Z_3$). The transit time of the transmission lines is also equal (e.g., $\tau_2 = \tau_3$). For input pulse lengths on the order of the transit time of the transmission lines or smaller, a pulse transformer may output a pulse with a magnitude equal to the product of the input pulse magnitude and the number of parallel transmission lines forming the pulse transformer. In general, substantially all reflections from the ends of the transmission lines are cancelled by transmitted pulses from other transmission lines, and substantially all the energy is delivered to the load.

While the repeater device 30 can be described by the same circuit as a pulse transformer, it is distinct in that the transit times of the transmission lines forming the repeater are not equal (e.g., $\tau_2 \neq \tau_3$). Due to the unequal transit times of the repeater transmission lines, the pulses traveling down each line arrive at the output end and thus the load at different times. In some embodiments, the difference in transit times is equal to the input pulse width or expected pulse width at the output such that the two pulses appear at the output in direct succession. In other embodiments, the difference in transit times can be less than the input pulse width such that part of the output pulses from each line are superimposed at the output while the overall pulse width at the output is increased from the input. In other embodiments, the difference in transit times can be longer than the input pulse width or expected pulse width at the output of the transmission lines, resulting in output pulses appearing at the load with increased time separation.

Figure 3:
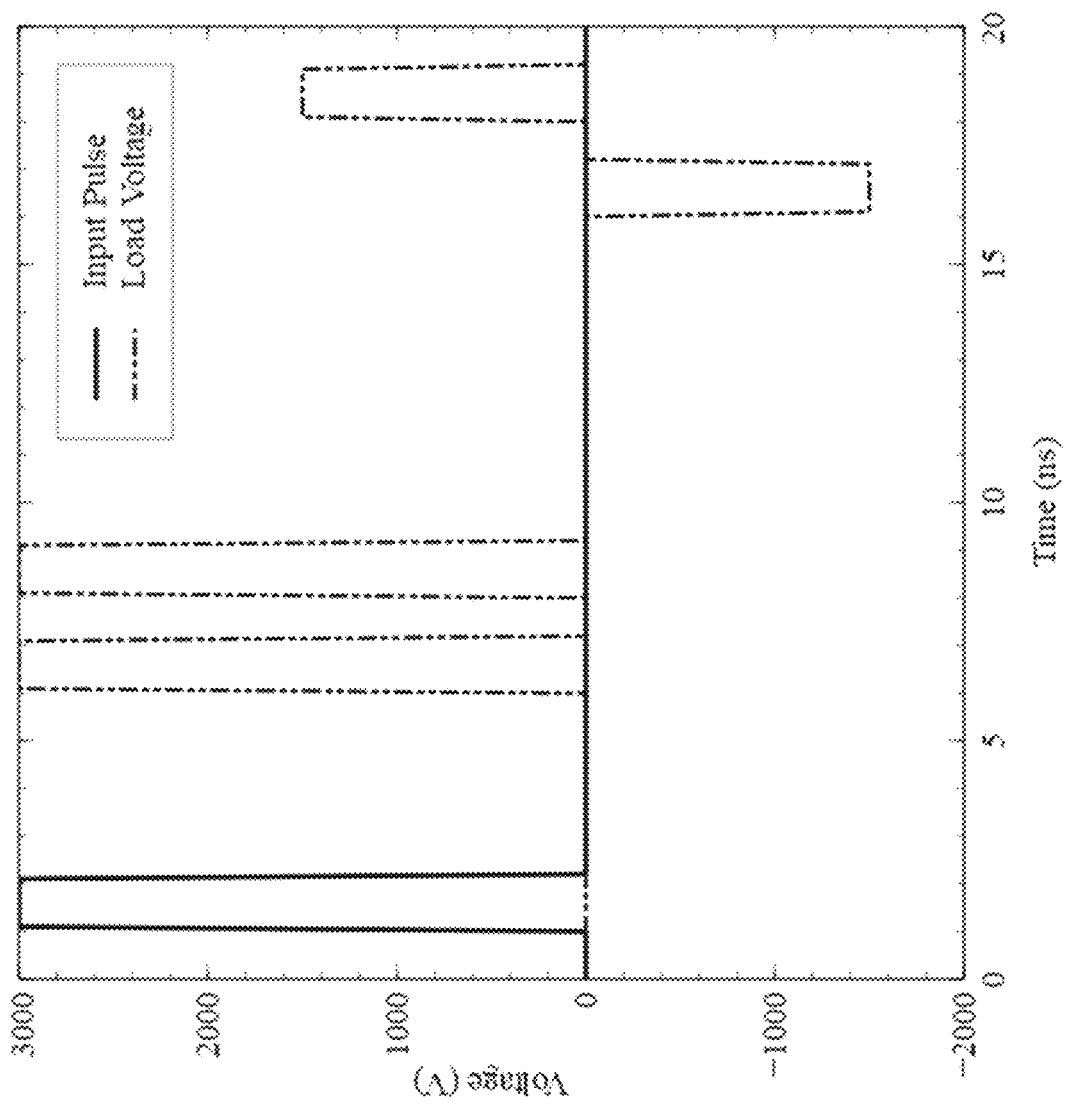
FIG. 3 illustrates exemplary waveforms for an input and output of the repeater device.

FIG. 3 illustrates exemplary waveforms for the input and output of a repeater device. In a simulation that produced these waveforms, the input pulse is defined to have a magnitude of 3,000 V and a pulse width of 1 ns. The rise and fall times of the input pulse are both 0.1 ns. The repeater device is formed by two transmission lines with equal characteristic impedance. One transmission line has a transit time of 5 ns, and the other transmission line has a transit time of 7 ns. The load impedance is equal to twice the characteristic impedance of the transmission lines in the repeater. The input pulse begins at time t=1 ns and is shown as the solid line. After a delay of 5 ns, corresponding to the transit time of the shorter transmission line, a pulse appears at the load with a magnitude of 3,000 V.

Similarly, after a delay of 7 ns from the start of the input pulse, corresponding to the transit time of the longer transmission line, a second pulse arrives at the load with a magnitude of 3,000 V. Thus, the repeater device produces separate pulses for each parallel transmission line in the repeater with the same magnitude as the input pulse. Unlike the case of a pulse transformer, the reflected and transmitted pulses at the output of the transmission lines are not perfectly canceled. Therefore, pulses travel back towards the input end of the transmission lines, where they are reflected and transmitted again to the output end of the transmission lines. This causes multiple pulses of lower magnitude and varying polarity arriving at the load after multiple transit times along the transmission lines of the repeater device. In some embodiments, the devices are designed to have shorter transit times to allow the reflected pulses to constructively or deconstructively add to the signal at the load. In some embodiments, the devices are designed to have longer transit times to ensure the reflected pulses arrive at the load after the desired signal has been delivered to the load.

Figure 4:
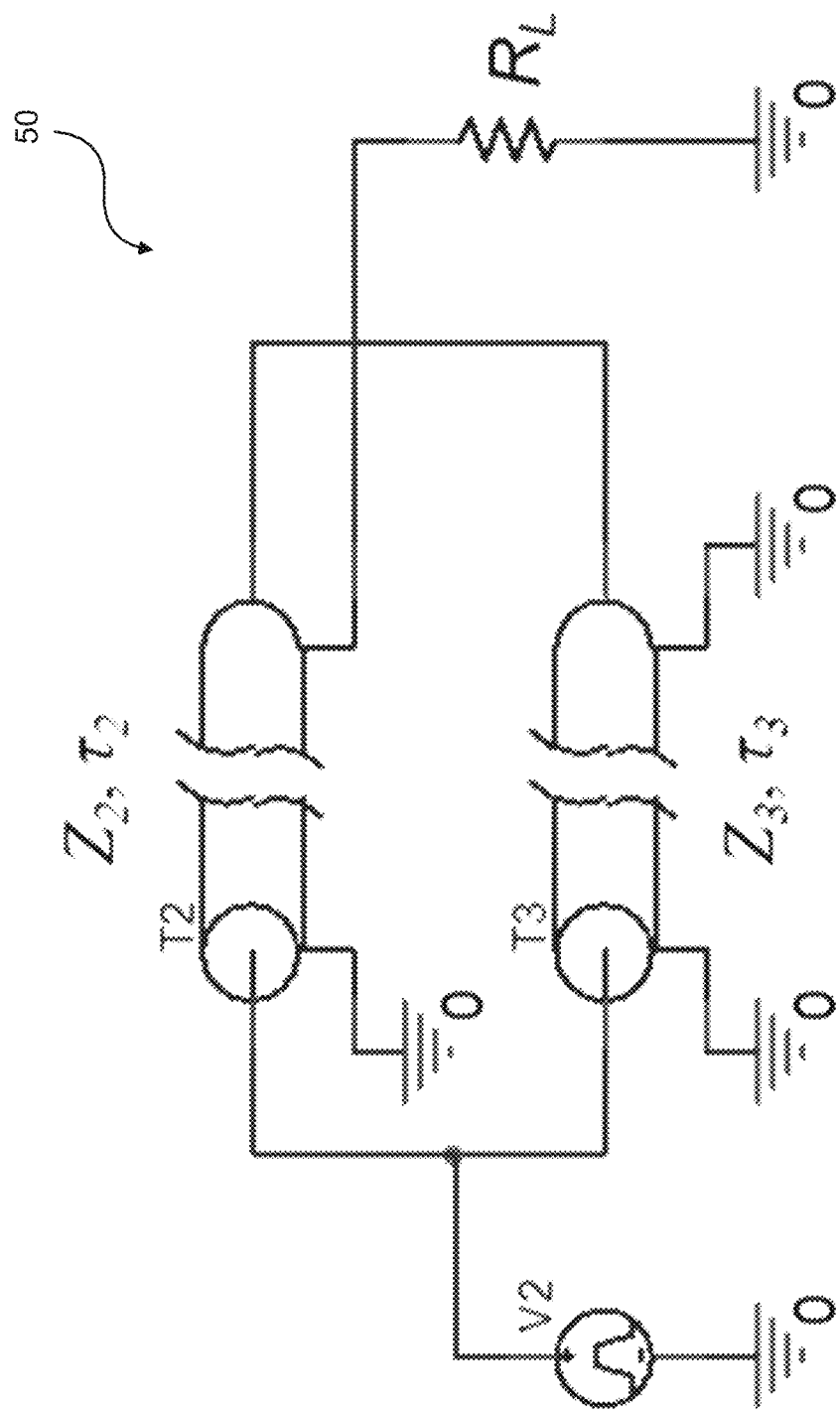
FIG. 4 is a circuit diagram of an exemplary inverter-repeater device.

A second type of circuit that may be implemented in a PIRFO is an inverter-repeater device 50 as shown in FIG. 4. Similar to the repeater device 30, the inverter-repeater device 50 produces multiple output pulses, depending on the number of parallel transmission lines forming the inverter-repeater 50. However, whereas the repeater device produces pulses with the same polarity as the input pulses, the inverter-repeater produces pulses of both the same polarity as the input pulses and the opposite (inverted) polarity as the input pulses.

In this example, two transmission lines form the inverter-repeater device, but any number of transmission lines greater than one can be used. The transmission lines are electrically in parallel at the input and are driven by the input pulse. In some embodiments, the characteristic impedance of the transmission lines in parallel are equal (e.g., $Z_2 = Z_3$). In some embodiments, the parallel arrangement of transmission lines at the input is designed to match the impedance of the source of the input signal. As with the repeater, at the output ends of the transmission lines (e.g., the ends opposite the end fed by the input signal), one transmission line, T3, is referenced to ground. Unlike the repeater device of FIG. 2, the conductors that were not grounded at the inputs are directly connected to each other at the output. The output end of the conductor of T2 that was grounded at the input is connected to the load impedance $R_L$.

In some embodiments, the characteristic impedances of the transmission lines of the inverter-repeater 50 are equal (e.g., $Z_2 = Z_3$). In some embodiments, the impedance of the load is equal to the product of the characteristic impedance of the transmission lines and the number of transmission lines (e.g., $R_L = 2Z_2 = 2Z_3$). Similar to the repeater device 30 of FIG. 2, the transit times of the transmission lines forming the inverter-repeater are not equal (e.g., T2 T3). Due to the unequal transit times of the inverter-repeater transmission lines, the pulses traveling down each line arrive at the output end and thus the load at different times. In some embodiments, the difference in transit times is equal to the input pulse width or expected pulse width at the output such that the two pulses appear at the output in direct succession. In other embodiments, the difference in transit times can be less than the input pulse width such that part of the output pulses from each line are superimposed at the output while the overall pulse width at the output is increased from the input. In other embodiments, the difference in transit times can be longer than the input pulse width or expected pulse width at the output of the transmission lines, resulting in output pulses appearing at the load with increased time separation. Unlike the repeater 30 of FIG. 2, the polarities of the output pulses from each transmission line are different due to the connection of the output conductors.

Figure 5:
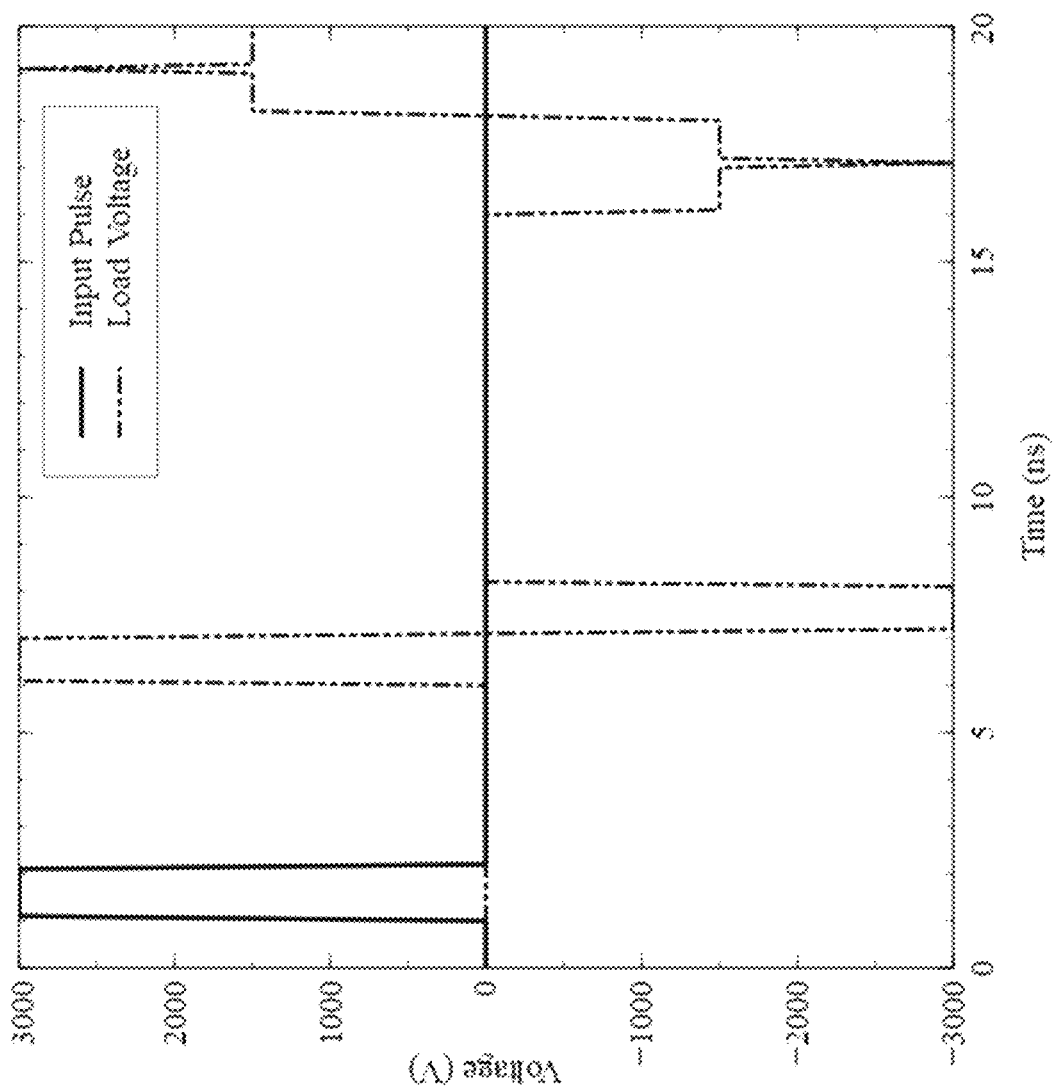
FIG. 5 illustrates an exemplary relationship between input and output signals of an inverter-repeater device.

The waveforms of FIG. 5 illustrate examples of the relationship between the input and output signals of the inverter-repeater 50. The simulation parameters are generally the same as those previously described for the repeater device except that the transit time of the longer transmission line is now 6 ns. The connections at the output end of the inverter-repeater transmission lines are made according to those shown in FIG. 4. After a 5 ns delay from the start of the pulse at the input to the inverter-repeater transmission lines, the first output pulse arrives at the load. The polarity of the first output pulse is generally the same as the input pulse, and the magnitude is generally equal to the input pulse at 3,000 V. Since the difference in transit times is equal to the pulse width of the input pulse, the second pulse arrives at the load immediately after the end of the first pulse. The polarity of the second pulse is inverted relative to the input pulse and the first output pulse, but the magnitude is generally the same at 3,000 V. Thus the inverter-repeater can produce a bipolar RF signal with peak-to-peak magnitude of twice the input pulse magnitude. Reflected and transmitted signals propagate back toward the input end of the transmission lines and are reflected and transmitted again to the output.

Part of the waveform resulting from these reflected and transmitted signals are shown in FIG. 5 at shown time t=16 ns. In some embodiments, the devices are designed to have shorter transit times to allow the reflected pulses to constructively or deconstructively add to the signal at the load. In some embodiments, the devices are designed to have longer transit times to ensure the reflected pulses arrive at the load after the desired signal has been delivered to the load. In some embodiments, a PIRFO may comprise one or more repeater devices without the use of an inverter-repeater device. In some embodiments, a PIRFO may comprise one or more inverter-repeater devices without the use of a repeater device. In other embodiments, a PIRFO may comprise a combination of one or more inverter-repeater devices and one or more repeater devices.

Figure 6:
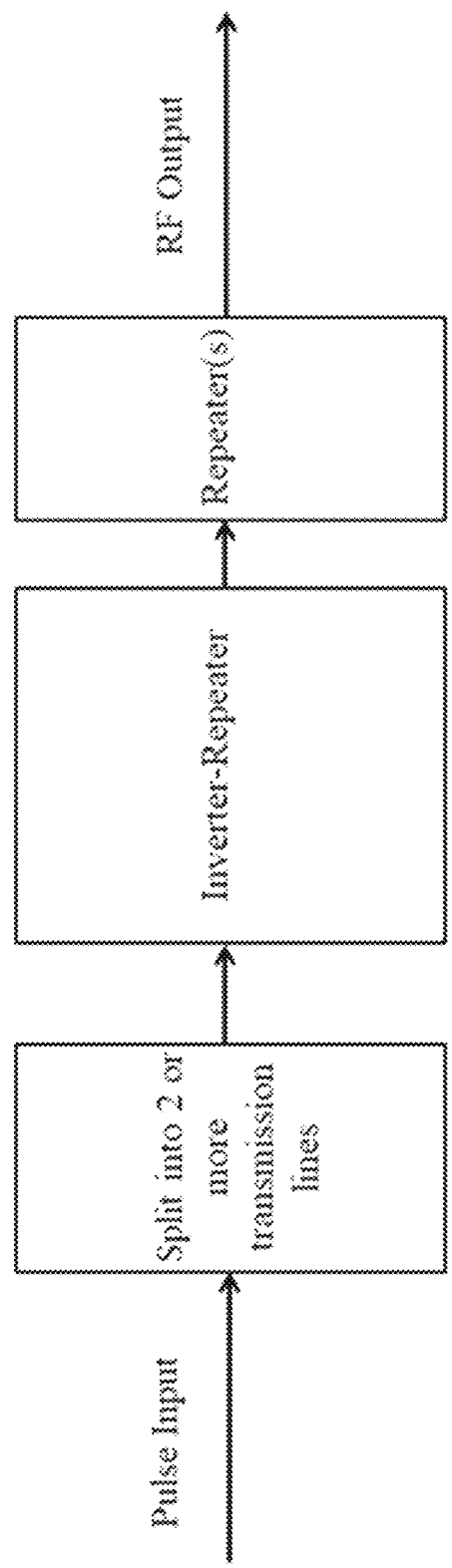
FIG. 6 is a block diagram of an exemplary energy flow in a PIRFO device.

FIG. 6 shows a block diagram of energy flow in one embodiment comprising one inverter-repeater device and one or more repeater devices. In this embodiment, a transient electromagnetic signal is input to the PIRFO. The input signal can be a unipolar pulse, bipolar pulse, or burst or continuous RF signal. The input signal is split into two or more transmission lines at the input of either an inverter-repeater or repeater. In one embodiment, the first device at the input of the PIRFO is an inverter-repeater. At the output of the inverter-repeater, the input pulse has been replicated as two pulses with the polarity of one output pulse opposite to the polarity of the input pulse. The output of the inverter-repeater is input to a repeater device. The bipolar output of the inverter-repeater is duplicated by the repeater device to generate a bipolar output signal with an increased length of the output signal from the inverter-repeater. Additional repeaters can be added to further increase the length of the output signal and/or further increase the output impedance of the PIRFO. However, there are tradeoffs to increasing the number of repeaters and thus RF cycles, including lower peak power at the load, increased dispersion from the transmission lines, and/or increased ringing/noise after the first RF burst. The output of the last repeater device is fed to a load, which could be a resistive load, a transmission line, an antenna, or any other electromagnetic load.

The peak power may be limited by dielectric breakdown within the transmission lines and interconnections of the PIRFO. Since non-linear materials are not used, the PIRFO can be operated over a wide range of input voltages/power up to the breakdown limit of the dielectrics. Assuming a stripline structure based on polyimide flexible circuit board (e.g., Pyralux) with a thickness of 6 mils and dielectric strength of 6 kV/mil, the maximum input voltage would be 36 kV, corresponding to 259 MW peak input power on a 5Ω line. The output signal produced by input signals ranging from low voltage to several kilovolts will be consistent in waveform and bandwidth. This allows widely scalable operation to produce a range of field levels and effects.

In one embodiment, a PIFRO can also be embedded with switching elements to allow dynamic control of the PIRFO transmission line topology and thus the transit times of the transmission lines, altering the output frequencies and bandwidth. Alternatively, by including ferroelectric and/or ferromagnetic materials into the structure, dynamic control can be achieved by adjusting the materials' polarizations with external fields.

Figure 7:
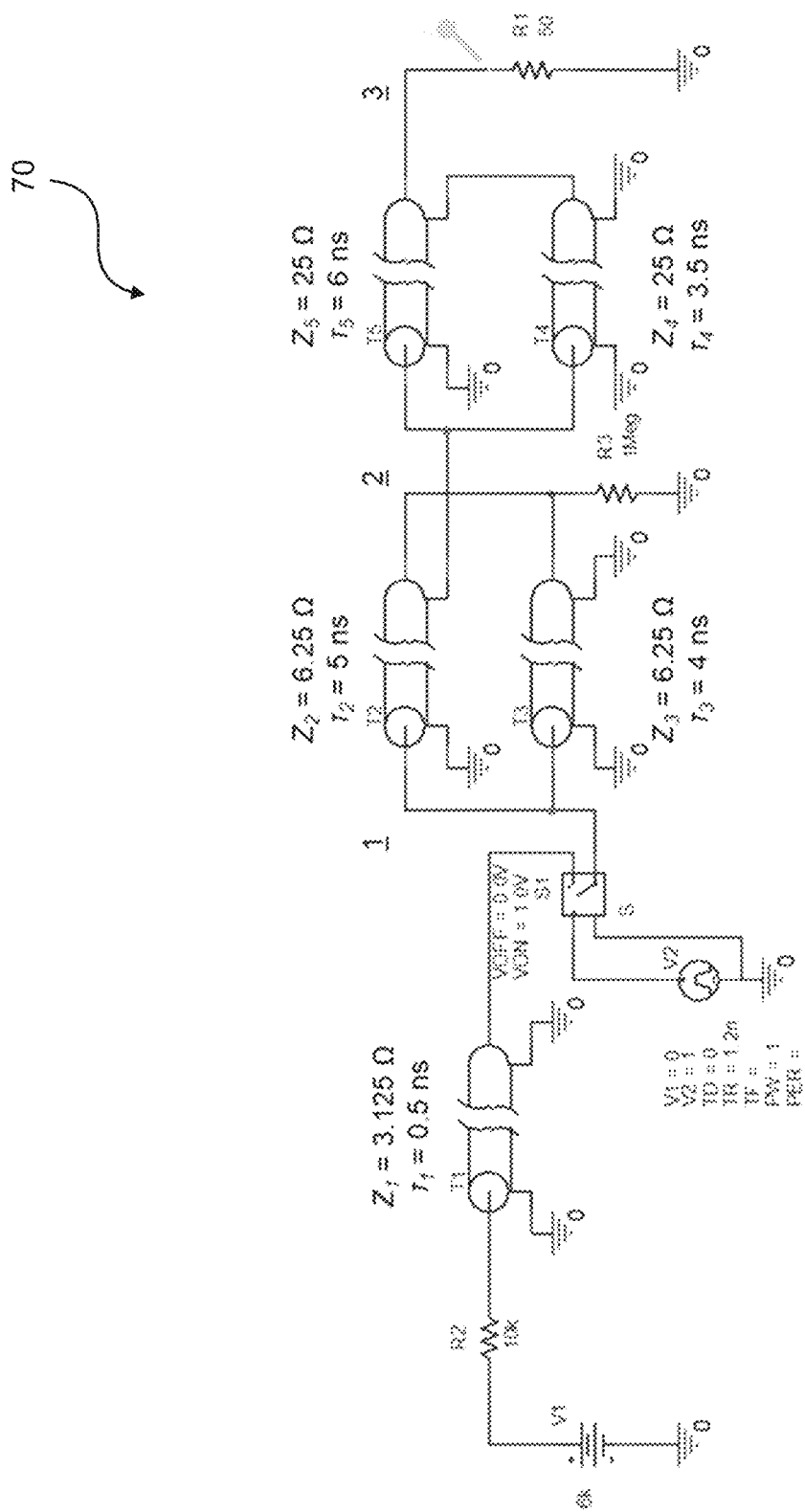
FIG. 7 is a circuit diagram of an exemplary two-stage PIRFO driven by a pulse forming line.

FIG. 7 illustrates one exemplary PIRFO 70. As will be further described later, the transmission line models are generally ideal in these examples with zero losses or dispersion. However, the other parameters defining the circuit were chosen to represent a more realistic mode of operation. In this example, transmission line T1 is a pulse forming line (PFL) with a characteristic impedance of 3.125Ω and a single-transit time of 0.5 ns. For the purposes of illustration, the pulse forming line is DC-charged to 6 kV by voltage source V1 through charging resistor R2. The component S1 represents a switch such as a photoconductive semiconductor switch (PCSS), avalanche switch, photo-triggered avalanche switch, or another switch with a relatively fast closing time compared to the transit time of the pulse forming line. Switch S1 is driven into an ON state of 200 mΩ such that the rise time of the voltage at the input to the PIRFO at the node labeled 1 is approximately 400 ps.

The PIRFO 70 is represented as two sets of transmission lines. Transmission lines T2 and T3 comprise an inverter-repeater device, and transmission lines T4 and T5 comprise a repeater device. Both sets of transmission lines are in parallel at the input and in series at the output. There are important differences in the electrical length of the lines and the series arrangements. Transmission lines T2 and T3 are an inverter-repeater device designed to convert a monopolar input pulse into a single bipolar cycle. As both lines have a characteristic impedance of 6.25Ω, the parallel arrangement is matched to the impedance of the PFL. The ~1 ns pulse output from the PFL propagates along both T2 and T3. In this first example, transmission line T3 is 1 ns shorter than T2, so the pulse from T3 reaches the output junction of these two transmission lines before the pulse on T2. Thus, a 1 ns positive pulse is seen at junction 2 after 4 ns of propagation time along T3. After 1 ns, the positive pulse from T3 at junction 2 goes to zero, and the pulse propagating on T2 reaches junction 2. Since the output connection on T2 is flipped, the pulse output from T2 has the opposite polarity as the previous pulse from T3. This method of delaying one of two identical pulses and reversing the polarity of the output of one of the transmission lines converts a unipolar pulse into a single bipolar cycle. Since the output of T2 and T3 are connected in series, the output impedance is 12.5Ω. In this embodiment, the output of T2 and T3 is matched to two 25Ω transmission lines, T4 and T5, in parallel. It should be noted that even when the two sets of transmission lines are matched in an ideal model, power is sent back towards the PFL due to both reflections from each transmission line and transmission from one transmission line to another. Due to the staggered timing of the arrival of the pulses at junctions 2 and 3, it is generally not possible to prevent reflected power. However, it is possible to design the PIRFO to efficiently convert the reflected power into RF when it is reflected back from the PFL.

Transmission lines T4 and T5 may also have different transit time lengths, but the output is not reversed on either transmission line. The single bipolar cycle propagates down both T4 and T5 toward the load, R1. In one embodiment, the single RF cycle along T4 reaches the load first and delivers a single RF cycle to the load. Since the two 25Ω transmission lines are in series, they are matched to the 50Ω load. Then, the RF cycle on T5 reaches the load and delivers a second RF cycle to the load. In this way, transmission lines T4 and T5 act as a repeater of the input RF.

Figure 9:
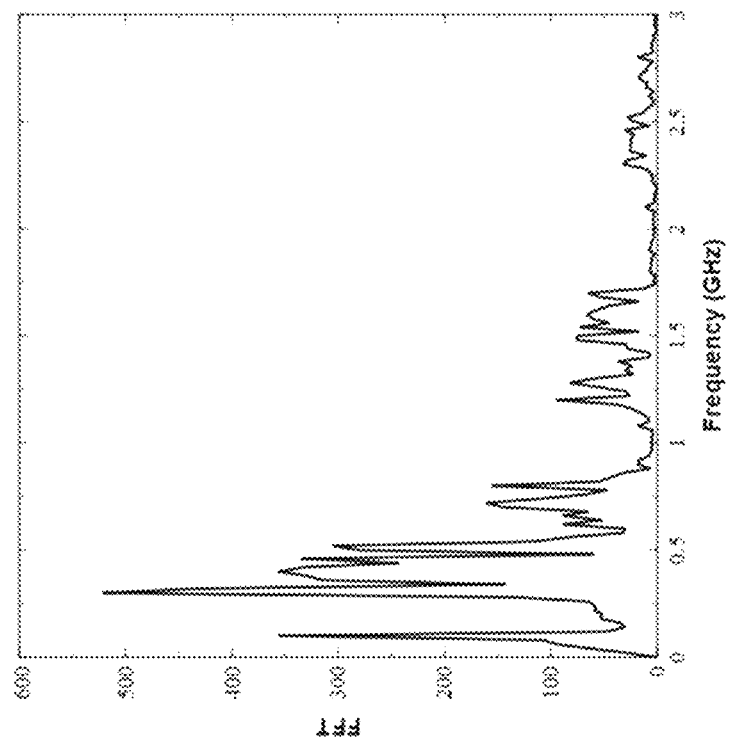
FIGS. 8 and 9 are graphs of a voltage at load and an FFT of the voltage signal of the PIRFO, respectively.
Figure 8:
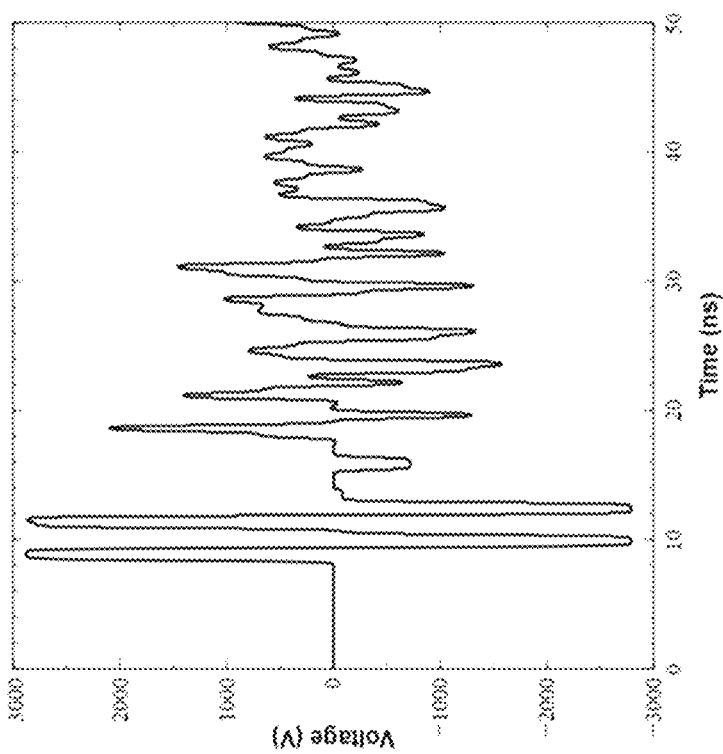

FIGS. 8 and 9 shows the simulated output of the PIRFO 70 depicted in FIG. 7. For example, FIGS. 8 and 9 are graphs of a voltage at load (FIG. 8) and an FFT of the voltage signal (FIG. 9) of the PIRFO 70, where $\tau_3$=4 ns and $\tau_2$=5 ns. The transmission line impedances may be selected for impedance matching between each stage, and the length of the transmission lines may be chosen to produce two cycles of RF as the initial burst. In this embodiment, the load is 50Ω. The two cycles of RF at the beginning of the RF burst are generally equal in magnitude with a peak-to-peak voltage nearly equal to the initial charging voltage. The slight reduction is due to losses in the switch model, which assumes a rise time of 400 ps and on-resistance of 200 mΩ. After a delay due to the relatively long transmission line lengths used in this example, a second RF burst resulting from reflected power in producing the initial burst reaches the load. This noisier signal also includes several relatively high-amplitude oscillations. On the frequency spectrum of the FFT, the lowest peak is at 100 MHz followed by a relatively wide band from approximately 275 to 550 MHz. Higher frequency peaks are noted at 720 and 800 MHz as well as smaller peaks around 1.2, 1.5, and 2.25-2.5 GHz.

While the preceding example provides two cycles of RF with equal magnitude at the beginning of the burst, the RF signal after the first two cycles has a lower magnitude and becomes noisier than the initial RF burst. While this type of signal may be desirable, it should be noted that relatively small changes in the transmission line lengths can change the output signal and the corresponding bandwidth of the signal. The following example uses the same parameters as the first example except that the length of transmission line T2 is reduced from 5 ns to 4.5 ns.

Figure 11:
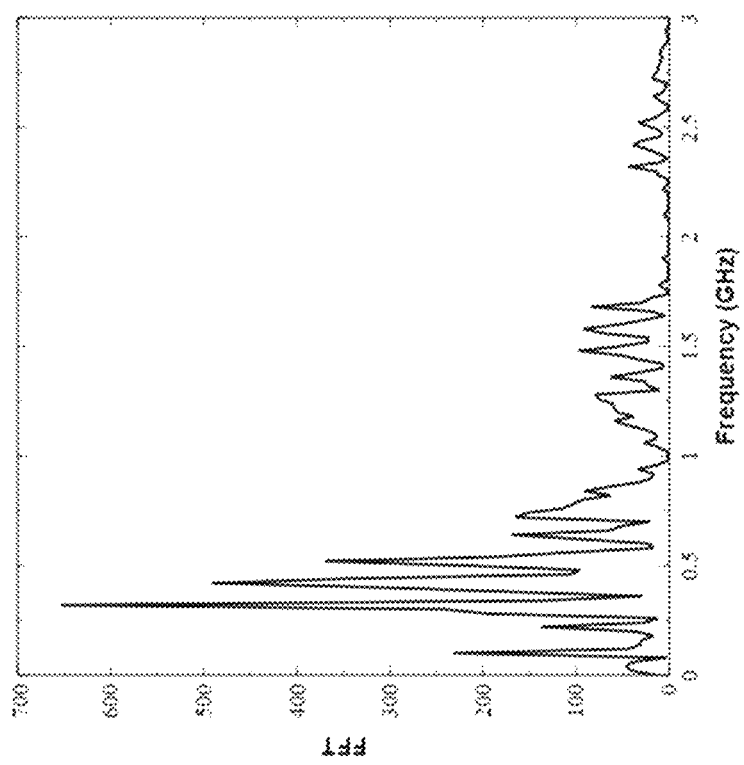
FIGS. 10 and 11 are graphs of a voltage at load and an FFT of the voltage signal for the PIRFO with modified transmission line lengths, respectively.
Figure 10:
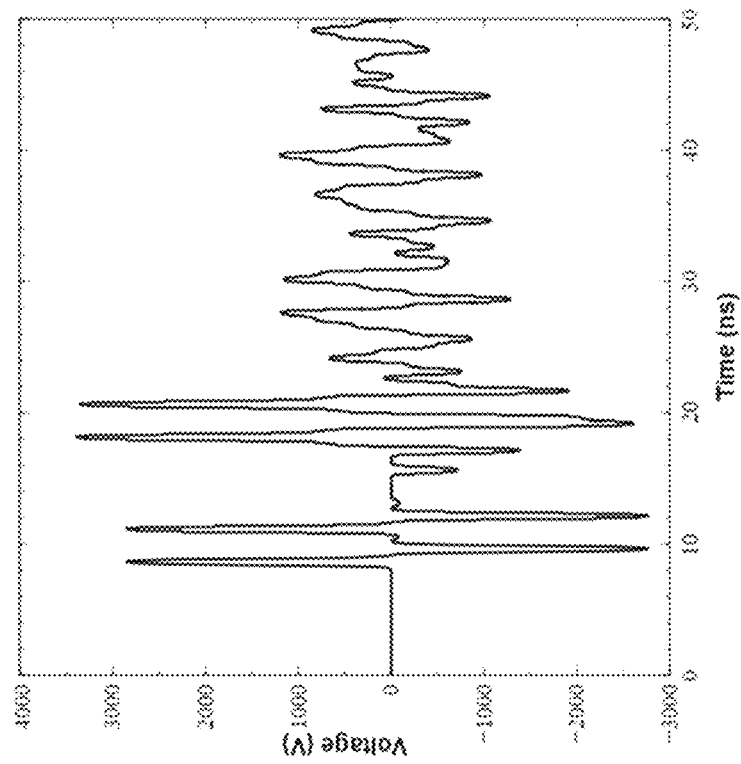

FIGS. 10 and 11 are graphs of a voltage at load (FIG. 10) and an FFT of the voltage signal (FIG. 11) for the PIRFO 70 with modified transmission line lengths, where $\tau_3$=4 ns and $\tau_2$=4.5 ns, in accordance with one exemplary embodiment disclosed herein. As shown in FIG. 10, the PIRFO 70 still produces two full cycles with equal magnitude and a peak-to-peak voltage near the initial charging voltage. However, the relatively wide pulse width seen in FIG. 10 due to the 1 ns input pulse from the PFL is now much shorter in FIG. 11 due to interference in the timing of pulse arrival at the output of the transmission lines. It is also notable that some of the following cycles have peak magnitudes on par with and slightly larger than the initial two cycles. In many cases, the higher peak power in the RF following the initial burst would be advantageous. As seen from the FFT, the frequency content was also altered from this change in transmission line length. In particular, the wide band noted in the first example up to about 550 MHz is now altered to more distinct peaks at 100, 220, 320, 420, 520, 640, 720, and 840 MHz.

Figure 12:
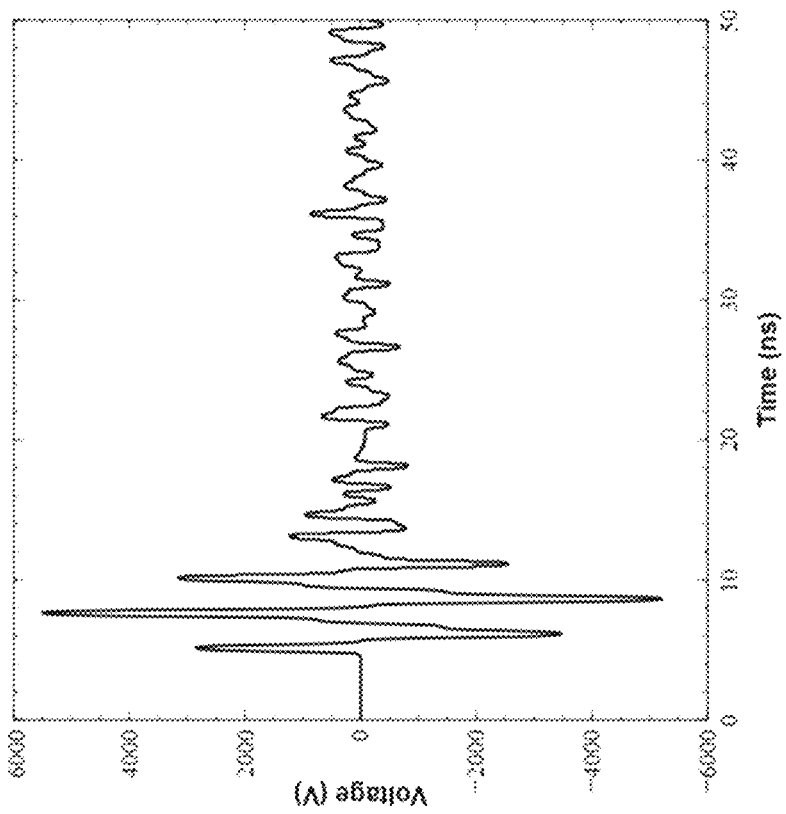
FIGS. 12 and 13 are additional graphs of a voltage at load and an FFT of the voltage signal for the PIRFO with modified transmission line lengths, respectively.
Figure 13:
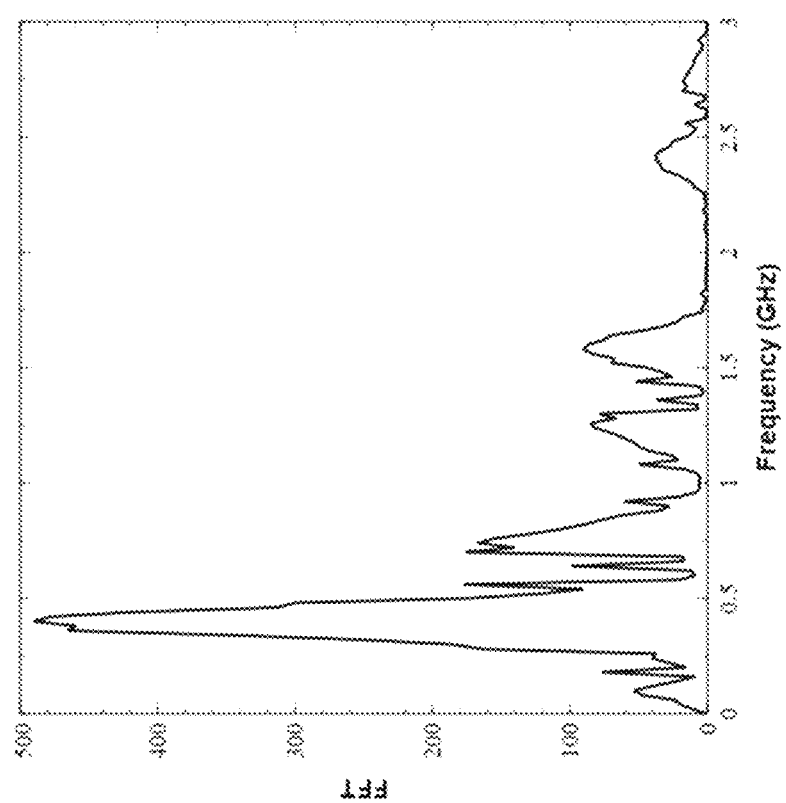

FIGS. 12 and 13 illustrate additional graphs of a voltage at load and an FFT of the voltage signal for the PIRFO with modified transmission line lengths, respectively, where $\tau_3$=0.5 ns and $\tau_2$=1 ns. In this exemplary embodiment, P generally has the same parameters as the first example except that the transmission line lengths of T2 and T3 have been changed to 0.5 and 1 ns, respectively. As shown in FIG. 12, the shorter transmission line lengths produce constructive interference within the first few cycles. This causes higher amplitude of the RF in the first few cycles and less noise following the initial RF burst. The maximum peak-to-peak cycle is nearly twice the initial charge voltage of the PFL. This variation of the PIRFO 70 produces the highest peak power but fewer total RF cycles. When analyzing the FFT, it is clear that the 100 MHz peak is lower in amplitude, likely due to the lower amplitude of the RF following the first few high power cycles. The higher frequency content has both a higher amplitude and wider bandwidth than previous examples. These peaks are noted between approximately 270-570 and 690-800 MHz as well as significant higher frequency peaks centered around 1.25, 1.58, 2.4, and 2.75 GHz. The transmission line lengths and impedances used in these simulations are exemplary and are not required for operation of the PIRFO 70. By modifying the impedances and/or transmission line lengths, the output signal can be altered to control the peak power and frequency content of the output signal among other parameters of interest.

The physical implementation of the transmission lines forming the PIRFO devices 70 can be realized in multiple types of transmission lines, including coaxial, planar, including variations of microstrip and stripline lines, twisted pair, twinax, and others. The following embodiments are shown in a planar geometry of microstrip and stripline lines. This geometry lends itself to implementation on printed circuit boards or similar substrates consisting of sheets of a dielectric and metallized traces forming the conductors. Connections between the lines energized at the input can be made without interrupting the continuity of the grounded lines. The impedance of the lines can easily be altered by varying the width of the traces.

FIGS. 14 and 15 illustrate a 3D model of an inverter-repeater device 90 implemented in a planar geometry simulated in software, such as CST Microwave Studio produced by Computer Simulation Technology AG. In the 3D model examples, the PIRFO devices 70 are stimulated by a waveguide port 91. The waveguide port 91 in the simulation software is simulated as an infinitely long transmission line extending from the port in the direction opposite of the 3D model. Therefore, the short length of the transmission line present at the port 91 in the 3D model can be considered to be extended such that reflections from the 3D model that propagate back to the port are not reflected back to the 3D model being simulated.

Figure 17:
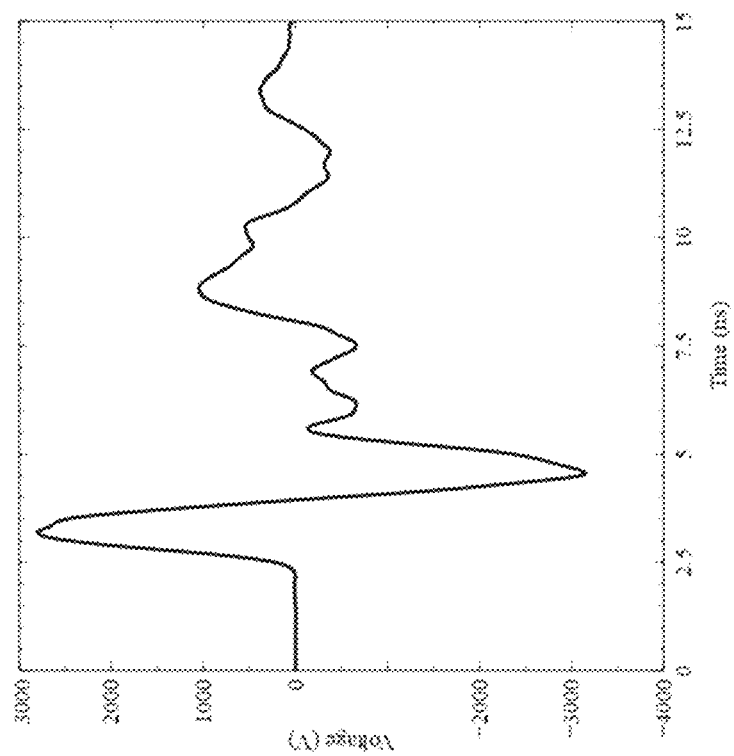
FIGS. 16 and 17 are graphs from the simulation of the 3D model of the planar inverter-repeater device of FIGS. 14 and 15.
Figure 16:
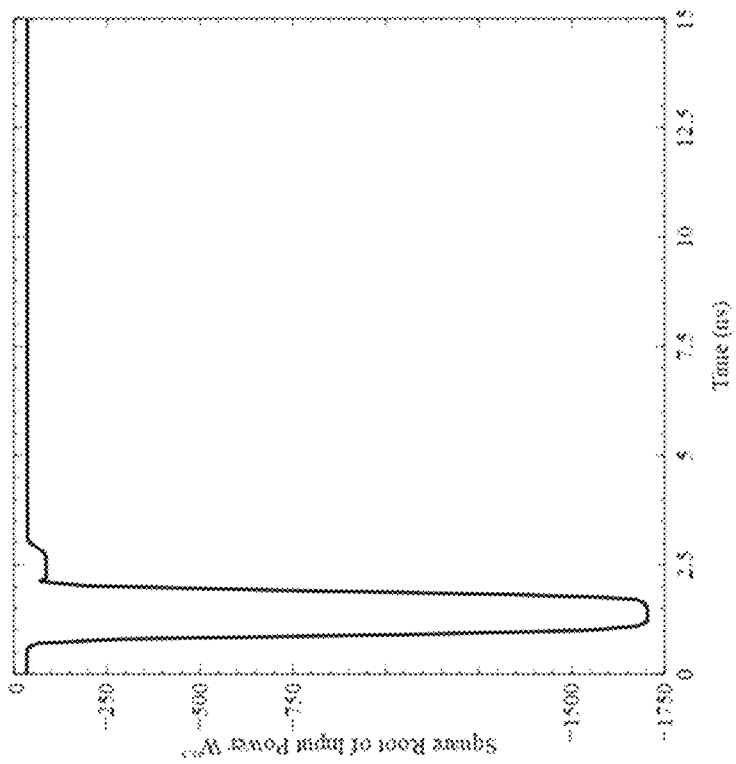

FIGS. 16 and 17 are graphs from a simulation of the 3D model of the planar inverter-repeater device illustrated in FIGS. 14 and 15. More specifically, FIG. 16 illustrates an input pulse in units of $W^{1/2}$. And, FIG. 17 illustrates an output from the inverter-repeater in units of V. A pulse input is injected into the 3D model from the waveguide port as defined by the graph of FIG. 16. The input signal to a waveguide port is defined as the square root of the input power. Thus, the magnitude shown in FIG. 17 corresponds to a peak input voltage of approximately 3,000 V into an input impedance of approximately 3.125Ω, corresponding to a peak input power of nearly 2.9 MW.

Figure 18:
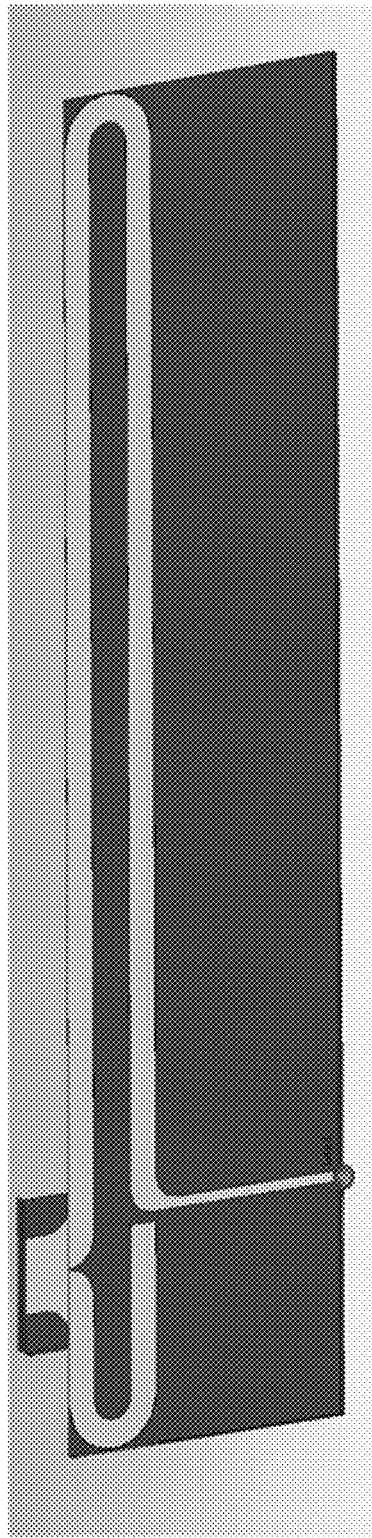
FIGS. 18 and 19 illustrate a 3D model of a planar repeater section.
Figure 19:
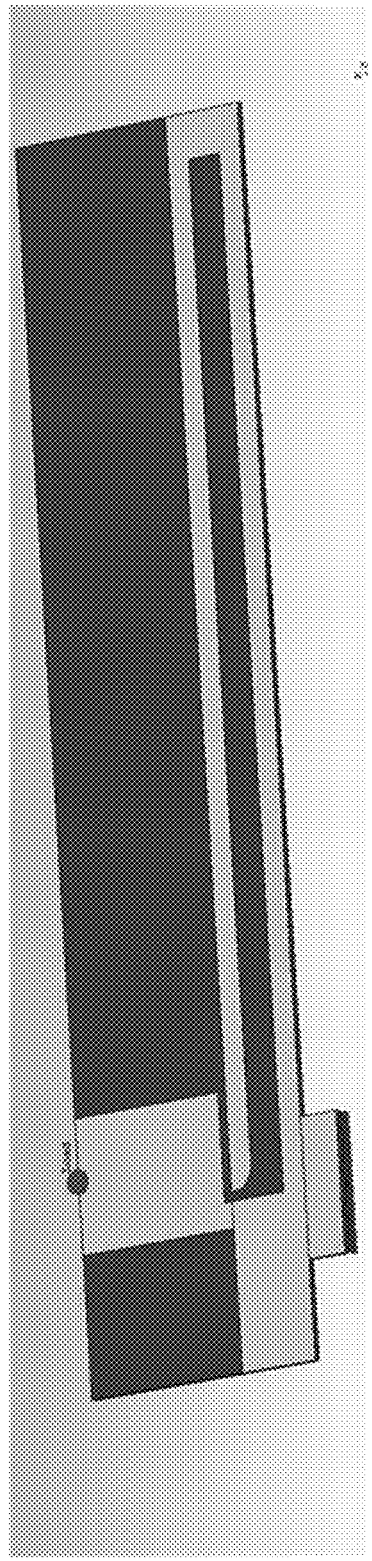

FIGS. 18 and 19 illustrate a 3D model of a planar repeater section. The substrates in the 3D models shown here are defined to have a dielectric constant of 4.3 and a thickness of 1.3 mm. The width of the trace adjacent to the port 91 is 7 cm, corresponding to a characteristic impedance of approximately 3.125Ω. The energized trace is split into two traces of 3.3 cm, corresponding to characteristic impedances of around 6.25Ω. These traces travel in opposite directions and loop around to directly connect to each other as the ungrounded conductors of an inverter-repeater are shorted at their output ends. The bottom view of FIG. 19 shows the inverter-repeater with the previously described traces hidden to reveal the trace that is grounded at the input from the waveguide port. On the right-hand side of this figure, the transmission line that is grounded at both ends is electrically connected at both ends of the trace from the top view. However, on the left-hand side of the bottom view of FIG. 19 the trace that is grounded at the input is not directly connected to the grounded input except along the length of the trace. This is the output conductor of the inverter-repeater when referenced to the ground at the input. This output trace is seen in both the top and bottom views as a 1.5 cm output strip over a ground path that cannot be seen in either view. This output transmission line has an impedance of around 12.5Ω and is terminated in a lumped element resistor of 12.5Ω, which is shown in blue.

Figure 21:
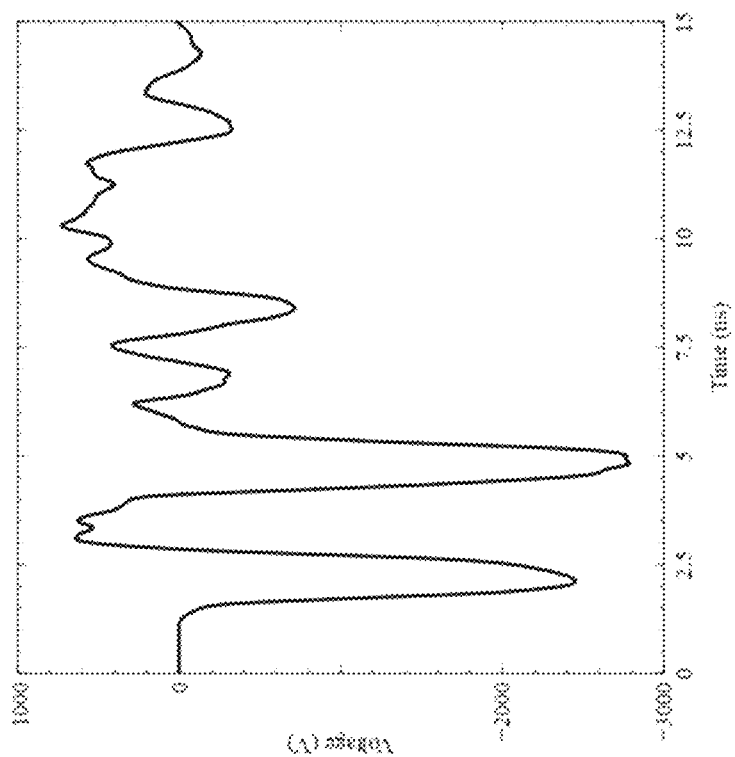
FIGS. 20 and 21 are graphs from a simulation of the 3D model of a planar inverter section.
Figure 20:
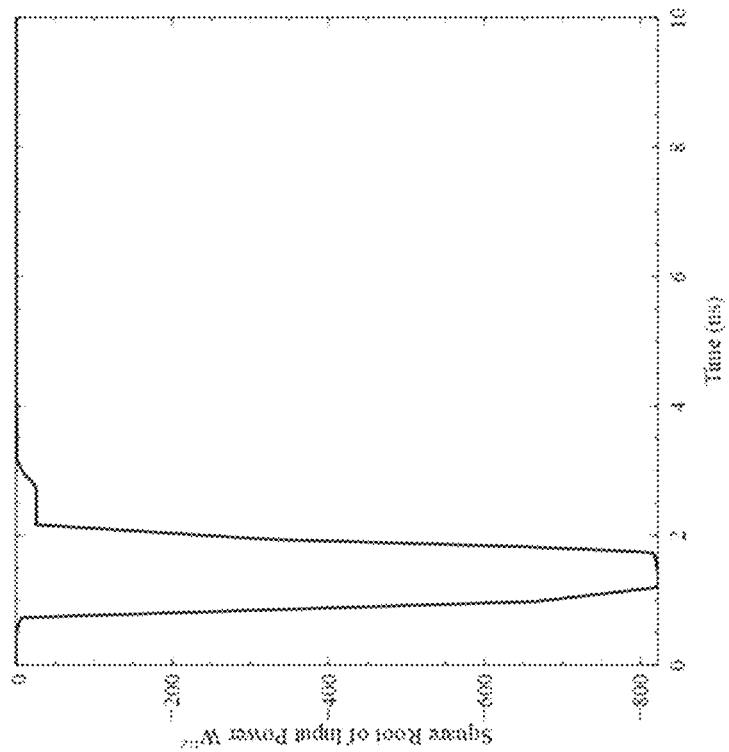

The input pulse shown in FIG. 20 has a rise time of approximately 400 ps and a full-width, half maximum pulse width of approximately 1 ns. The voltage simulated at the 12.5Ω lumped element resistor load on the output transmission line is shown in FIG. 21. A single bipolar RF cycle is seen at the output with a peak-to-peak output voltage approximately equal to twice the input voltage pulse magnitude. Additional RF of a lower magnitude follows the single full power RF cycle due to reflected and transmitted signals between the transmission lines. Thus, the inverter-repeater device has been modeled and simulated to perform as expected in a planar geometry.

The graphs of FIGS. 20 and 21 show the input and output signals of a simulation of the 3D model of the repeater, respectively. In FIG. 20, an input pulse in units of W½ is illustrated. In FIG. 21, an output from the repeater in units of V. Since the input impedance of the repeater model is approximately 12.5Ω, the magnitude of the input pulse is lower than the inverter-repeater example to maintain an input voltage of approximately 3,000 V. The voltage at the lumped element load shows two distinct pulses. With additional optimization of the 3D model, the waveform can be improved to increase the magnitude of the two pulses to close to 3,000 V each. While this example may not be optimized, it provides a demonstration of the implementation of a repeater circuit in a planar transmission line geometry.

Figure 22:
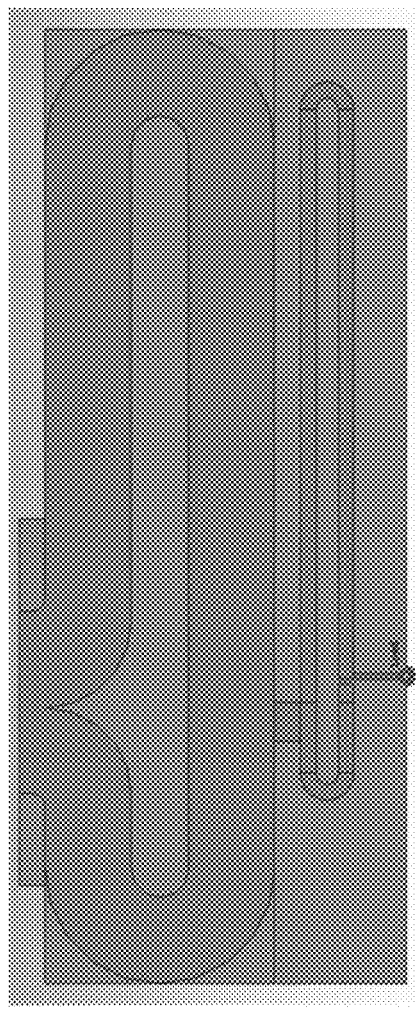
FIGS. 22 and 23 illustrate a 3D model of a planar combination of inverter-repeater and repeater sections.
Figure 23:
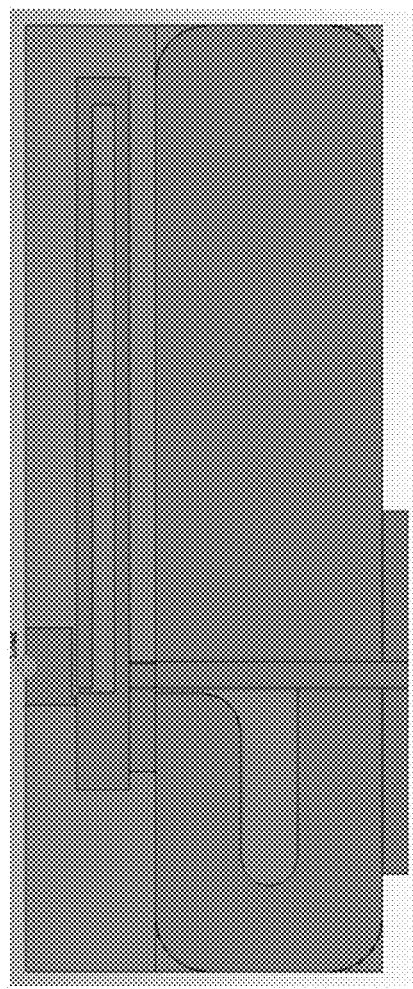

FIGS. 22 and 23 shows an exemplary 3D model of a PIRFO simulated in software with a pulse fed into an inverter-repeater followed by a repeater. The input impedance of the PIRFO is approximately 3.125Ω, and the output impedance is terminated in a lumped element load of 50Ω. In one embodiment, the dimensions of the PIRFO 100 are approximately 36.5 cm×13.9 cm×less than 0.3 cm.

The waveguide port is adjacent to a trace with a width of 1.5 cm, so the input impedance is around 12.5Ω. The load impedance represented by the blue lumped element resistor is 50Ω. The input trace is split into two traces with widths of 0.6 cm for characteristic impedances of around 25Ω. As shown in FIG. 22, the two traces extend in opposite directions and loop back to a common point close to where they are fed. However, unlike the inverter-repeater above, the traces are not connected at their ends. FIG. 23 shows the opposite side of the substrate. The shorter transmission line is grounded at both the input and output ends, so the ground trace is not separated. The longer transmission line is not grounded at its output end. Instead, the ends of the transmission lines that appear unconnected in the top and bottom views are electrically connected to each other through via(s) through the substrate at their ends. The output signal from the repeater is a microstrip with a width of 2.25 mm over a ground trace for an output impedance of around 50Ω.

Figure 24:
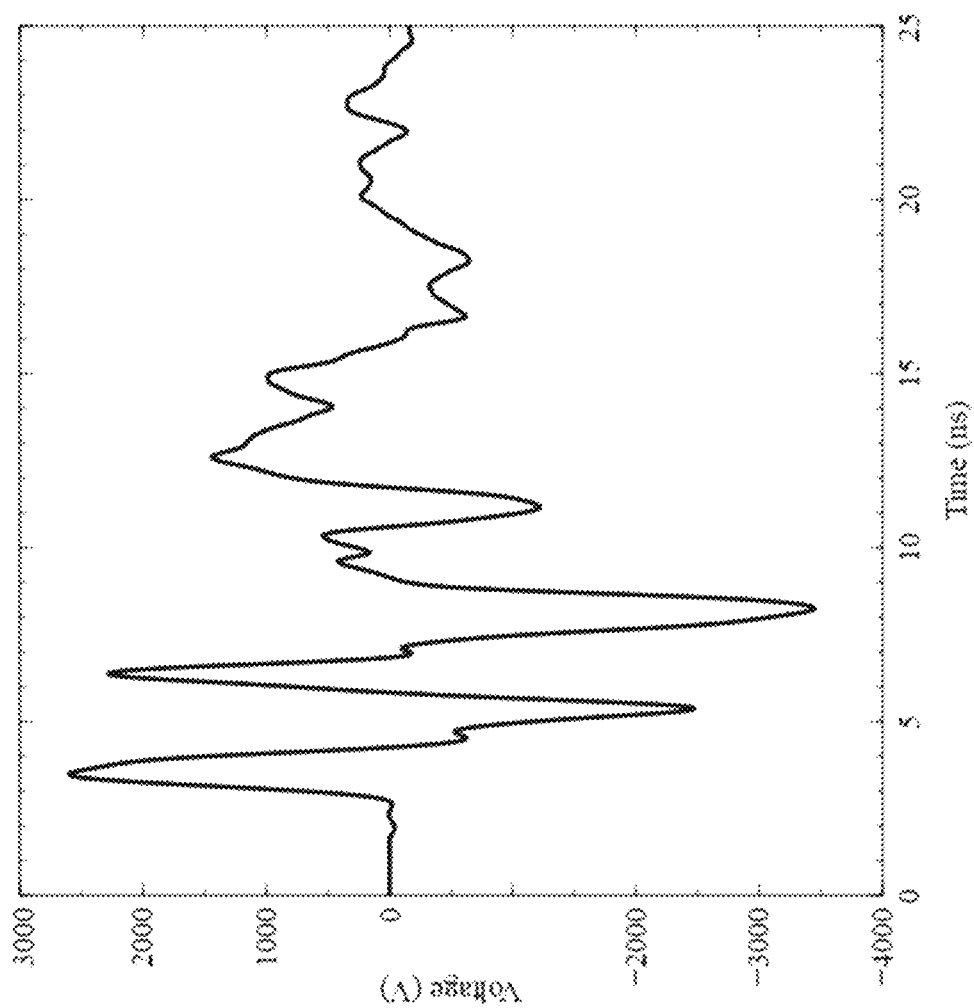
FIG. 24 is a graph of a simulated output voltage of combined planar inverter-repeater and repeater sections.

Since the input impedance of the 3D model is approximately 3.125Ω, the input pulse for this simulation is generally the same as that in the inverter-repeater example is shown above. The output pulse at the 50Ω load. In this embodiment, the single RF cycle output from the inverter-repeater device is doubled by the repeater device to output two full RF cycles. With further optimization of the 3D model, the magnitude of the RF in the first two full RF cycles can be made to be approximately 3,000 V. This simulation demonstrates how a PIRFO 100 consisting of one inverter-repeater device and one repeater device can transform a unipolar input pulse into two full cycles of RF at the same magnitude into a higher impedance load. Additional variations on these concepts, including changes to the transmission line lengths or impedances or the addition or removal of inverter-repeater or repeater devices, can change the output signal magnitude and frequency content. FIG. 24. illustrates a simulated output voltage of the 3D model of the planar combined inverter-repeater and repeater sections.

The embodiments herein may be combined in a variety of ways as a matter of design choice. Accordingly, the features and aspects herein are not intended to be limited to any particular embodiment. Furthermore, the embodiments can take the form of hardware, firmware, software, and combinations thereof. In this regard, certain embodiments herein may employ various combinations of hardware and software. In one embodiment, such software includes but is not limited to firmware, resident software, microcode, etc.

Figure 25:
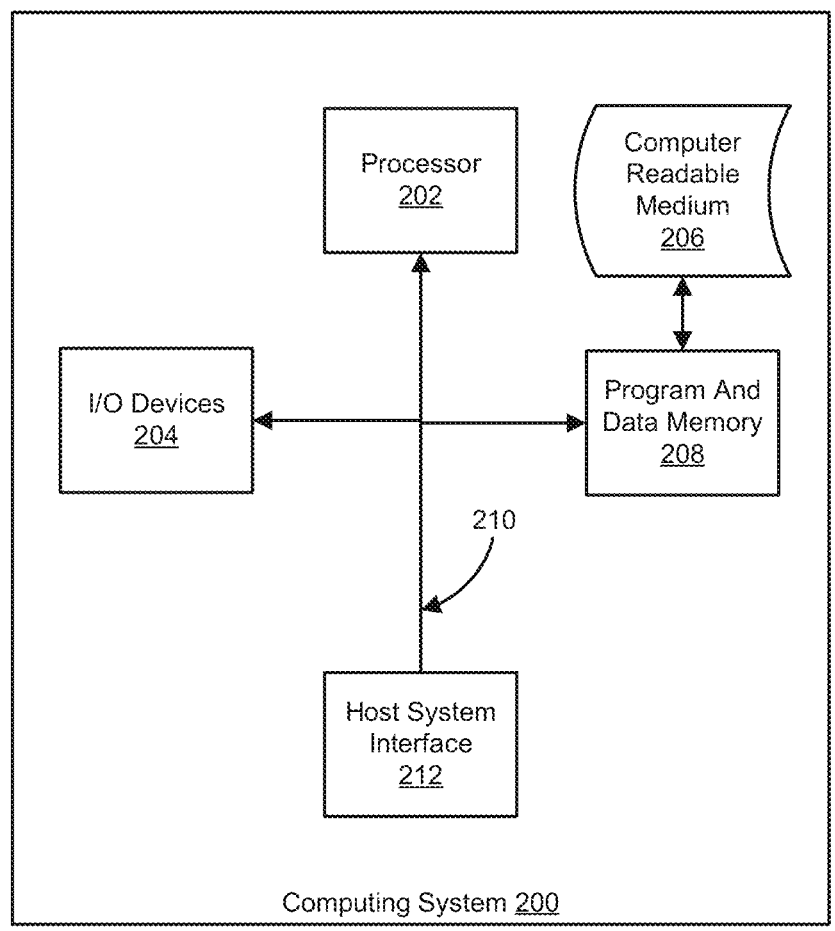
FIG. 25 is a block diagram of an exemplary computing system in which a computer readable medium provides instructions for performing methods herein.

FIG. 25 illustrates a computing system 200 in which a computer readable medium 206 may provide instructions for performing any of the methods and processes disclosed herein. Furthermore, some aspects of the embodiments herein can take the form of a computer program product accessible from the computer readable medium 206 to provide program code for use by or in connection with a computer or any instruction execution system. For the purposes of this description, the computer readable medium 206 can be any apparatus that can tangibly store the program code for use by or in connection with the instruction execution system, apparatus, or device, including the computing system 200.

The computer readable medium 206 can be any tangible electronic, magnetic, optical, electromagnetic, infrared, or semiconductor system (or apparatus or device). Some examples of a computer readable medium 206 include solid state memories, magnetic tapes, removable computer diskettes, random access memories (RAM), read-only memories (ROM), magnetic disks, and optical disks. Some examples of optical disks include read only compact disks (CD-ROM), read/write compact disks (CD-R/W), and digital versatile disks (DVD).

The computing system 200 can include one or more processors 202 coupled directly or indirectly to memory 208 through a system bus 210. The memory 208 can include local memory employed during actual execution of the program code, bulk storage, and/or cache memories, which provide temporary storage of at least some of the program code in order to reduce the number of times the code is retrieved from bulk storage during execution.

Input/output (I/O) devices 204 (including but not limited to keyboards, displays, pointing devices, I/O interfaces, etc.) can be coupled to the computing system 200 either directly or through intervening I/O controllers. Network adapters may also be coupled to the computing system 200 to enable the computing system 200 to couple to other data processing systems, such as through host systems interfaces 212, printers, and/or or storage devices through intervening private or public networks. Modems, cable modems, and Ethernet cards are just a examples of network adapter types.

Based on the foregoing, it will be seen that these embodiments are well adapted to attain all the ends and objects hereinabove set forth together with other advantages which are inherent to the various structures and methods disclosed herein. It will be understood that certain features and sub-combinations are of utility and may be employed without reference to other features and sub-combinations. This is contemplated by and is within the scope of the claims. Since many possible embodiments may be made without departing from the scope thereof, it is also to be understood that all matters herein set forth or shown in the accompanying drawings are to be interpreted as illustrative and not limiting.

The various embodiments described above and illustrated in the drawings are presented by way of example only and are not intended to limit the concepts and principles of the embodiments disclosed herein. As is evident from the foregoing description, certain aspects of the present embodiments are not limited by the particular details of the examples illustrated herein, and it is therefore contemplated that other modifications and applications, or equivalents thereof, will occur to those skilled in the art.

The terms "having" and "including" and similar terms as used in the foregoing specification are used in the sense of "optional" or "may include" and not as "required". Many changes, modifications, variations and other uses and applications of the present embodiments will, however, become apparent to those skilled in the art after considering the specification and the accompanying drawings. All such changes, modifications, variations, and other uses and applications which do not depart from the spirit and scope of the embodiments are deemed to be covered by the claims which follow.

What is claimed is:

1. A device, comprising:
   a signal source operable to provide an electromagnetic pulsed signal;
   two or more transmission lines coupled to the signal source at first ends of the two or more transmission lines to receive the electromagnetic pulsed signal; and
   a load coupled to at least one of the two or more transmission lines,
   wherein the two or more transmission lines have an impedance that substantially matches an impedance of the signal source, and wherein the two or more transmission lines are operable to transform the electromagnetic pulsed signal into a bipolar oscillating radio frequency (RF) output signal at the load.

2. The device of claim 1, wherein: the two or more transmission lines comprise linear transmission lines and materials.

3. The device of claim 1, wherein: an electromagnetic transit time of the transmission lines is unequal.

4. The device of claim 1, wherein: the transmission lines are driven in parallel at the first ends of the two or more transmission lines.

5. The device of claim 1, wherein: the transmission lines are arranged in series.

6. The device of claim 1, wherein: the two or more transmission lines have a same polarity.

7. The device of claim 1, wherein: a polarity of at least one transmission line is inverted at an output.

8. The device of claim 1, wherein: the transmission lines are planar microstrip, planar stripline, coaxial, twisted pair, twinax, wire over plane, parallel lines, or various combinations thereof.

9. The device of claim 1, comprising one or more switching elements along lengths of the transmission lines that are operable to alter the lengths of the transmission lines.

10. The device of claim 3, wherein: a difference in transit times is equal to a pulse width of the electromagnetic pulsed signal.

11. The device of claim 3, wherein: a difference in transit times is less than a pulse width of the electromagnetic pulsed signal.

12. The device of claim 3, wherein: a difference in transit times is greater than a pulse width of the electromagnetic pulsed signal.

13. The device of claim 1, wherein: the device is driven by switches that are semiconductors, plasma based, spark gap, thyratron, pseudospark, or solid switches for frequency agility or frequency multiplication.

14. The device of claim 1, wherein: the device includes nonlinear materials for frequency multiplication, or generation of specific frequencies in the mesoband, narrowband, or wideband regime.

15. The device of claim 14, wherein the nonlinear materials are selected from: ferromagnetic; ferroelectric; piezoelectric; semiconductor or any other nonlinear material.

16. The device of claim 1, wherein:
   the two or more transmission lines have a same impedance.

17. The device of claim 1, wherein:
   the two or more transmission lines are coupled to ground at the first ends of the transmission lines.

18. The device of claim 1, wherein:
   the two or more transmission lines comprise conductors that are coupled together at opposing ends of the two or more transmission lines.

19. The device of claim 1, wherein:
   the two or more transmission lines have an impedance that substantially matches an impedance of the load.

20. The device of claim 1, wherein:
   the two or more transmission lines are coupled to ground at second ends of the transmission lines.

* * * * *